United States Patent
Wang et al.

(10) Patent No.: US 6,791,323 B2
(45) Date of Patent: Sep. 14, 2004

(54) METHOD AND APPARATUS FOR MEASURING AND CORRECTING MOTION EFFECTS USING NAVIGATOR ECHOES

(75) Inventors: Yi Wang, Pittsburgh, PA (US); Thanh D. Nguyen, Pittsburgh, PA (US)

(73) Assignee: Cornell Research Foundation, Inc., Ithaca, NY (US)

(*) Notice: Subject to any disclaimer, the term of this patent is extended or adjusted under 35 U.S.C. 154(b) by 0 days.

(21) Appl. No.: 10/272,431

(22) Filed: Oct. 16, 2002

(65) Prior Publication Data

US 2003/0117136 A1 Jun. 26, 2003

Related U.S. Application Data

(60) Provisional application No. 60/329,811, filed on Oct. 16, 2001, and provisional application No. 60/373,820, filed on Apr. 19, 2002.

(51) Int. Cl.[7] .................................................. G01V 3/00
(52) U.S. Cl. .......................................................... 324/309
(58) Field of Search ................................... 324/307–309

(56) References Cited

U.S. PATENT DOCUMENTS

| | | | | |
|---|---|---|---|---|
| 5,122,747 A | * | 6/1992 | Riederer et al. | 324/309 |
| 5,947,900 A | * | 9/1999 | Derbyshire et al. | 600/410 |
| 6,073,041 A | * | 6/2000 | Hu et al. | 600/410 |
| 6,472,872 B1 | * | 10/2002 | Jack et al. | 324/309 |
| 6,516,210 B1 | * | 2/2003 | Foxall | 600/410 |
| 6,556,009 B2 | * | 4/2003 | Kellman et al. | 324/309 |
| 6,617,850 B2 | * | 9/2003 | Welch et al. | 324/309 |

OTHER PUBLICATIONS

Stephan Achenbach and Werner G. Daniel, M.D., Noninvasive Coronary Angiography—An Acceptable Alternative? 345 N.Eng. J.Med., 1909–10 (2001).*

W. Yong Kim, MD, PhD. et al., Coronary Magnetic Resonance Angiography For The Detection Of Coronary Stenoses, 345 N. Eng. J.Med., 1863–69 (2001).*

* cited by examiner

*Primary Examiner*—Dixomara Vargas
(74) *Attorney, Agent, or Firm*—Leydig, Voit & Mayer

(57) ABSTRACT

A method and apparatus for detecting displacement of an object using navigator echoes is presented. For motion that is linear in 3D, a linear regression on k-space data is performed by fitting a straight line to the motion-induced phase shift using a k-space weighted least squares minimization to find the displacement. For general motion due to rotation, dilation, and displacement, a rotation angle and dilation scaling factors are determined from the magnitude k-space data by a weighted least squares minimization. A displacement vector is then obtained from the phase data in k-space using a weighted least squares minimization. The weighting factor takes into account that the noise in k-space is inversely proportional to the signal to noise ration. For motion of coronary arteries, the k-space data is acquired in one embodiment using selective volumetric excitation and sampling the resulting excited signal with a trajectory sensitized to the motion of interest.

42 Claims, 14 Drawing Sheets

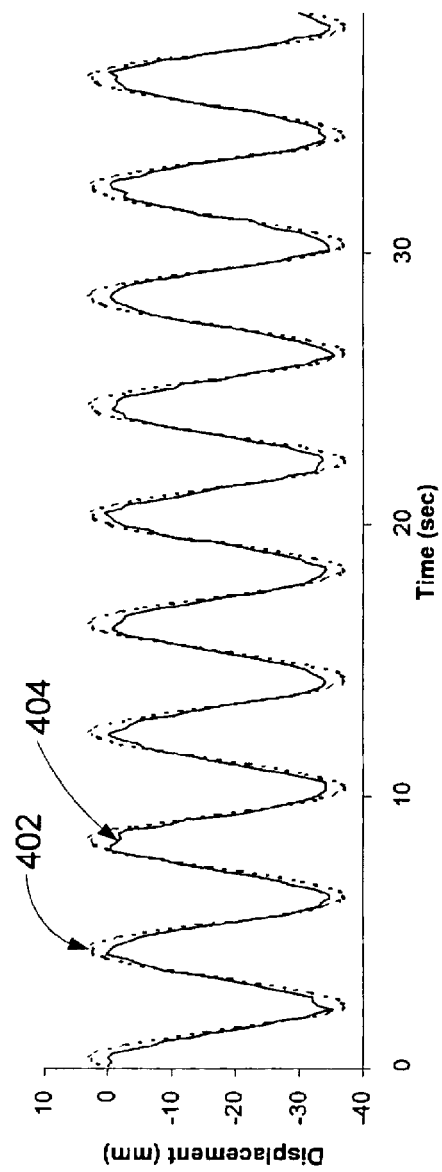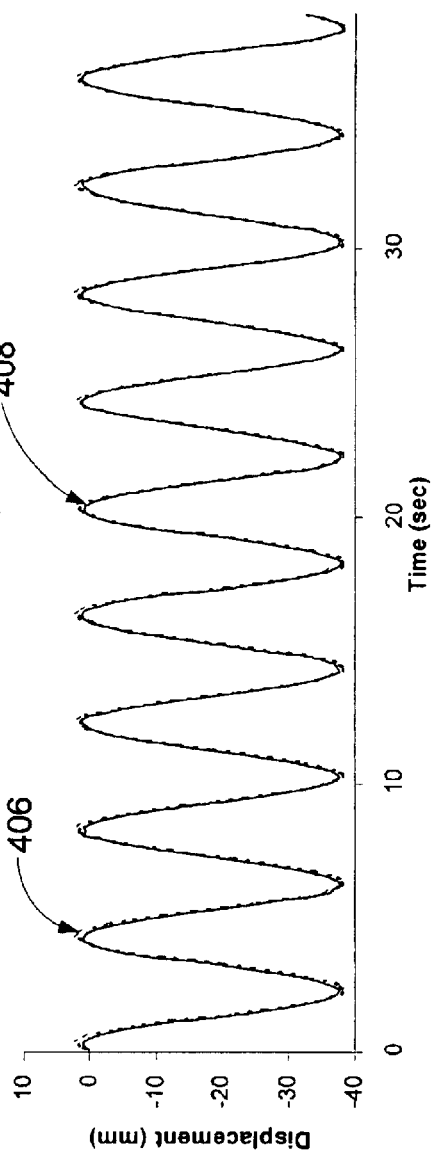

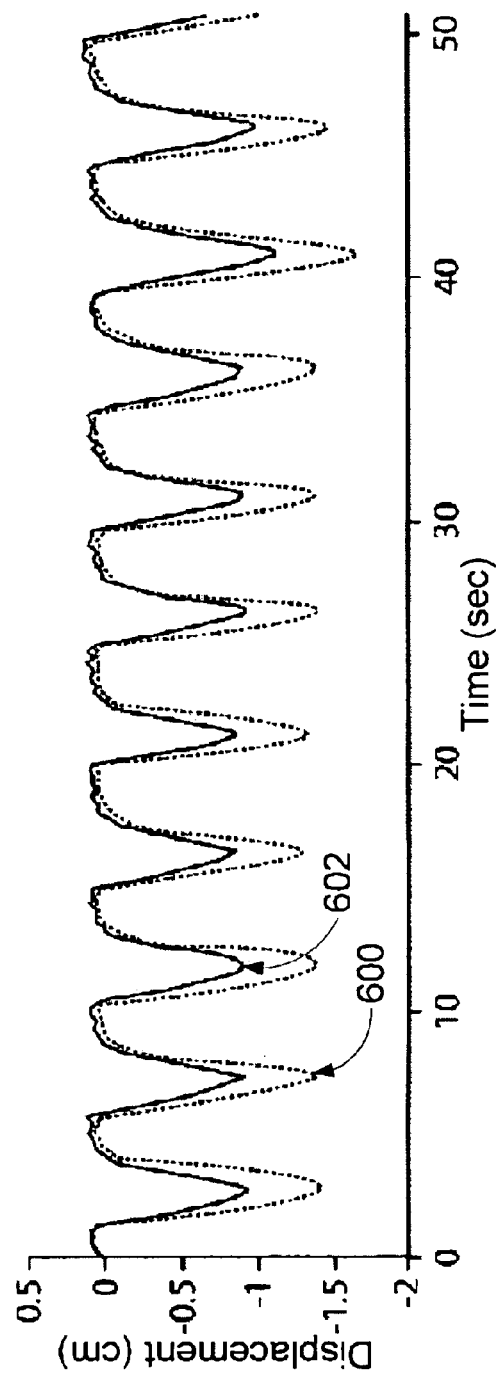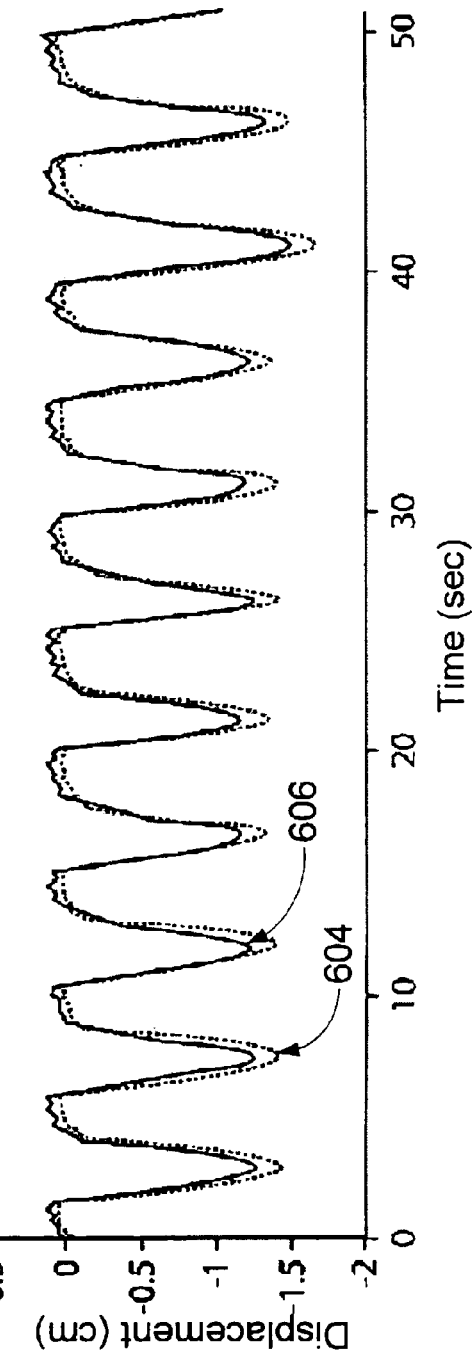

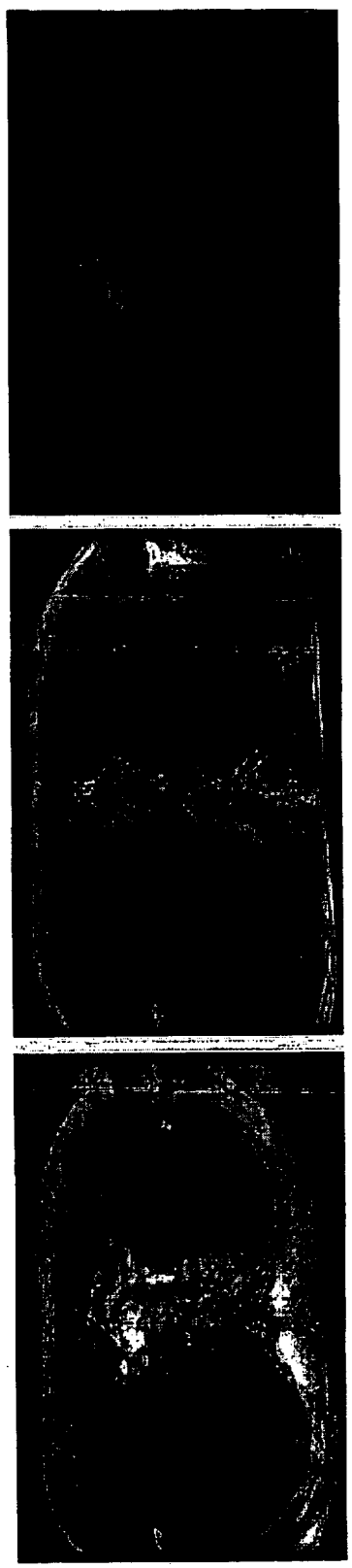

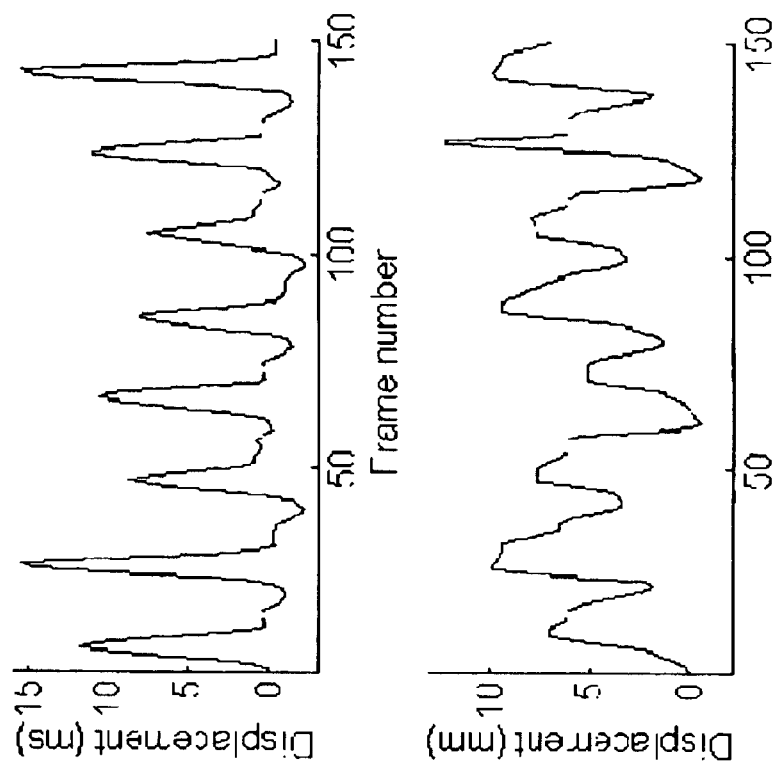
FIG. 13a
FIG. 13b
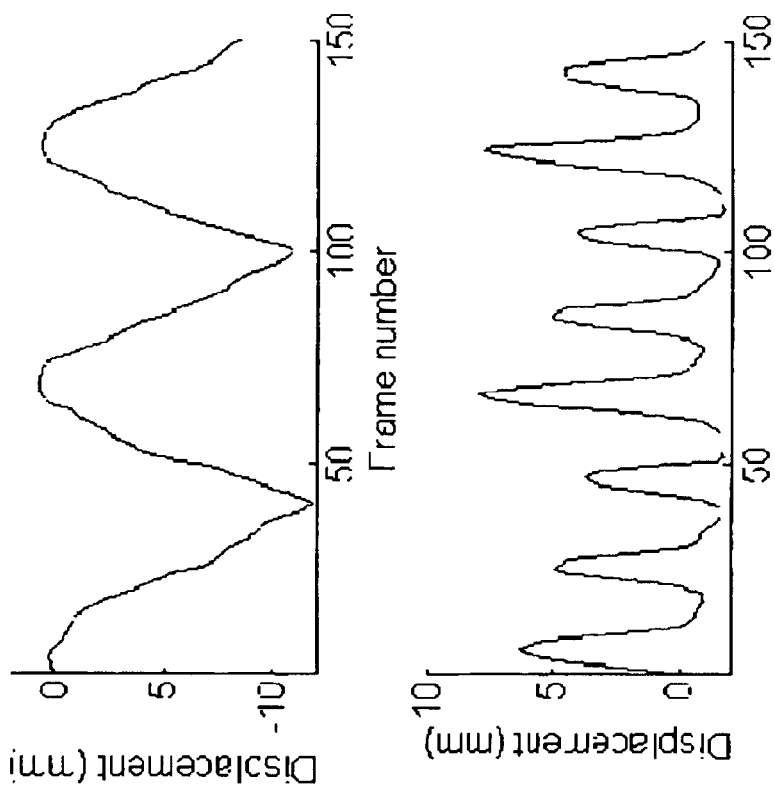
FIG. 13c
FIG. 13d

METHOD AND APPARATUS FOR MEASURING AND CORRECTING MOTION EFFECTS USING NAVIGATOR ECHOES

CROSS-REFERENCE TO RELATED PATENT APPLICATIONS

This patent application claims the benefit of U.S. Provisional Patent Applications No. 60/329,811, filed Oct. 16, 2001 and No. 60/373,820, filed Apr. 19, 2002.

STATEMENT REGARDING FEDERALLY SPONSORED RESEARCH OR DEVELOPMENT

This invention was made in part with Government support under NIH Grant Number HL62994 and HL64647-01A2 awarded by the U.S. Department of Public Health. The Government may have certain rights in this invention.

FIELD OF THE INVENTION

The present invention relates generally to medical diagnosis, and more particularly relates to magnetic resonance image data acquisition.

BACKGROUND OF THE INVENTION

Magnetic resonance imaging (MRI) is the method of choice for noninvasive diagnosis of soft tissue disease in humans, and has wide application in cardiovascular diseases. Fast gradient technology has made high-resolution 3D imaging possible, including magnetic resonance angiography (MRA) of coronary and pulmonary arteries. High resolution MRI is primarily impeded by physiologic motion such as respiration and gross patient movement.

Industry responded to the physiologic motion impediment by developing methods to suppress the artifacts caused by physiological motion. Motion correction requires precise motion information. One suppression approach is the navigator method, which detects motion prior to data acquisition and modifies data acquisition accordingly. Navigator techniques use image space navigator echoes for detecting motion during image data acquisition. Physiological motion causes global displacement in the navigator echo and results in a shift of the image space navigator echo compared to an image space reference navigator echo. The accuracy in extracting motion information from navigator echoes is crucial to the effectiveness of the navigator technique. An image space least squares method has been demonstrated to be an accurate method for extracting displacement. The image space least squares algorithm computes the variance for a shifted navigator echo with respect to a reference echo and determines the displacement by locating the shift position that gives the minimum variance. Other methods used include correlation and edge detection methods. However, these methods are time consuming on most host computers of MRI scanners and do not allow flexible real-time control of data acquisition due to the long processing times required.

For effective real-time control of data acquisition, the processing time for processing the navigator echo must be short enough so that there is little motion in the processing duration. When this occurs, the detected motion in the navigator echo is approximately the same as that in the acquired k-space data, thereby allowing effective real-time modification of data acquisition to suppress motion effects.

One approach taken to decrease processing time is to extract linear motion information from raw k-space data. If motion is linear in 3D, only the k-space phase data carries motion information. According to the Fourier shift theorem, a global displacement of d pixels of a reference navigator echo corresponds to a linear phase shift in the k-space data. Equation 1 shows this correspondence.

$$s_{dis}[x] = s_{ref}[x+d] \xrightarrow{DFT} S_{dis}[k] = S_{ref}[k]\exp\left(i\frac{2\pi}{N}kd\right) \quad [1]$$

In equation 1, $s_{ref}[x]$ is the reference navigator profile in image space, $s_{dis}[x]$ is the displaced profile in image space, $S_{ref}[k]$ is the reference navigator echo in k-space, $S_{dis}[k]$ is the displaced echo in k-space, and d is the displacement. Equation 1 illustrates that displacement is proportional to the slope of the phase change in k-space data.

One method to extract displacement information based upon the Fourier shift theorem was proposed by Ahn and Cho. The Ahn and Cho method is fast, requiring only 4N multiplications and 4N additions per displacement estimate. The Ahn and Cho method derives the relation in equation 2 for the displacement d from equation 1:

$$d = \frac{N}{2\pi}(\arg\{S_{dis}^*[k]S_{dis}[k+1]\} - \arg\{S_{ref}^*[k]S_{ref}[k+1]\}) \quad (2)$$

In equation 2, arg{·} is the phase operator, and $S^*_{ref}[k]S_{ref}[k+1]$ may be regarded as a kernel of the nearest neighbor correlation.

According to equation 2, only a pair of adjacent points is theoretically sufficient to derive the displacement information. In practice, all data points are contaminated with noise and the displacement derived from two points contains substantial error. To account for noise, all other points in the navigator echo can be averaged to reduce the noise error. Ahn and Cho proposed an average by taking the nearest neighbor correlation prior to the phase operator as shown in equation 3:

$$\frac{N}{2\pi}\arg E\{S^*[k]S[k+1]\} = \frac{N}{2\pi}\arg \sum_{k=-N/2}^{N/2-2} S^*[k]S[k+1] \quad (3)$$

E{·} is the expectation operator and the divider is dropped as it has no effect on the phase. Accordingly, the displacement is:

$$\hat{d}_{AHN} = \frac{N}{2\pi}\left(\arg \sum_{k=-N/2}^{N/2-2} S_{dis}^*[k]S_{dis}[k+1] - \arg \sum_{k=-N/2}^{N/2-2} S_{ref}^*[k]S_{ref}[k+1]\right) \quad (4)$$

It can be seen from equation 4 that points in k-space contribute equally to the final displacement estimate. Consequently, this method is susceptible to noise, particularly contributions from points at the edges of k-space where the noise dominates the signal. Additionally, the Ahn and Cho method is geared towards detecting translation (i.e., displacement). As such, it is suitable for detecting one dimensional motion, but is not effective when detecting general motion.

General motion involves rotation, dilation, and contraction and existing techniques do not work. The rotation, dilation, and contraction effects must be known to correct their motion effects. For example, the widely used pencil beam navigator echo techniques provides a good indication of cardiac motion. However, the pencil beam navigator echo technique cannot detect multiple motion components simultaneously. For example, it cannot effectively monitor the motion of coronary arteries because the motion of chamber blood interferes with the detection of heart motion.

BRIEF SUMMARY OF THE INVENTION

In view of the foregoing, it is a general aim of the present invention to enhance the speed and accuracy of suppressing motion effects in MRI systems.

In that regard, it is also an object of the present invention to minimize noise effects in navigator echoes.

A feature of the present invention is to detect a general motion due to rotation, dilation, and displacement.

A further feature is to detect general motion of coronary arteries due to rotation, dilation, and displacement from data acquired with volume selective excitation.

A further feature is to utilize algorithms which employ weighting factors based on the signal to noise ratio of each point.

In accordance with an embodiment of the instant invention, a method of detecting displacement comprises by fitting a function to the motion-induced phase shift using a k-space weighted least squares minimization to find the displacement where the weighting factor takes into account that the noise in k-space phase data is inversely proportional to the signal to noise ratio.

In accordance with a further embodiment of the instant invention, a method of detecting displacement comprises performing a linear regression on k-space data by fitting a straight line to the motion-induced phase shift using a k-space weighted least squares minimization to find the displacement, and using a weighting factor which takes into account that the noise in k-space phase data is inversely proportional to the signal to noise ratio.

In accordance with a further alternate embodiment of the instant invention, a method of detecting a general motion due to rotation, dilation, and displacement comprises determining a rotation angle and dilation scaling factors from the magnitude k-space data by a least squares minimization. Once the rotation angle and dilation scaling factors are determined, a displacement vector is obtained from the phase data in k-space using a least squares minimization. For example, in one embodiment, general motion of coronary arteries is detected by volume-selective excitation of the arteries. This is accomplished by transmitting a spatial spectral selective pulse to eliminate signals from the chest wall and to excite epicardial fat to produce an excited signal. The coronary motion is detected as described above.

Other objectives and advantages of the invention will become more apparent from the following detailed description when taken in conjunction with the accompanying drawing.

BRIEF DESCRIPTION OF THE DRAWINGS

The accompanying drawings incorporated in and forming a part of the specification illustrate several aspects of the present invention, and together with the description serve to explain the principles of the invention. In the drawings:

FIGS. 4a and 4b illustrate an example of actual and estimated displacements of a motion phantom;

FIG. 6a illustrates estimated displacements of a diaphragm in a human volunteer using a prior art k-space motion correction and a standard image space least squares motion correction;

FIG. 6b illustrates estimated displacements of a diaphragm in a human volunteer using k-space motion correction of the instant invention and a standard image space least squares motion correction;

FIG. 10a is an axial image of heart volume without water saturation;

FIG. 10b is an axial image of heart volume with water saturation;

FIG. 10c is an axial image of heart volume with water saturation and with spatial fat saturation;

FIG. 13a illustrates diaphragm motion in the SI direction without breath-holding obtained with the teachings of the present invention;

FIG. 13b illustrates coronary motion in the SI direction without breath-holding obtained with the teachings of the present invention;

FIG. 13c illustrates coronary motion in the AP direction without breath-holding obtained with the teachings of the present invention;

FIG. 13d illustrates coronary motion in the RL direction without breath-holding obtained with the teachings of the present invention;

Figure 1:
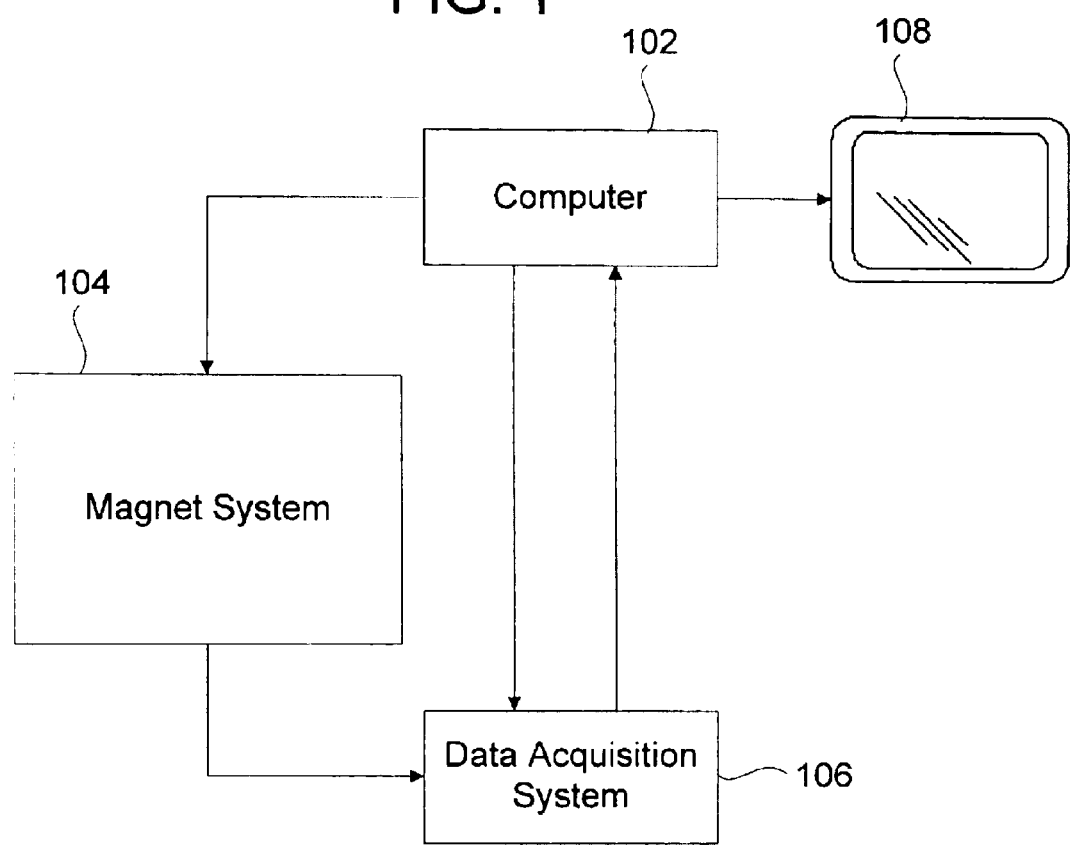
FIG. 1 is a block diagram generally illustrating an exemplary computer system on which the present invention resides.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Turning to the drawings, wherein like reference numerals refer to like elements, the invention is illustrated as being implemented in a suitable MRI data acquisition environment. Although not required, the invention will be described in the general context of computer-executable instructions, such as program modules, being executed by a personal computer. The invention may also be practiced in distributed computing environments where tasks are performed by remote processing devices that are linked through a communications network.

With reference to FIG. 1, a block diagram of an exemplary system 100 for implementing the invention is shown. The exemplary system includes a computer 102, a magnet system 104, a data acquisition system 106, and display 108. The magnet system 104, data acquisition system 106 and display 108 are well known in the art and need not be described in detail herein. In general terms, the computer 102 controls the gradient and RF magnets or coils (not shown) in the magnet system 104 via amplifiers (not shown). The computer 102 also controls the data acquisition system 106, processes the data acquired, and outputs an image to display 108.

Computer 102 typically includes at least some form of computer readable media. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory, or other memory technology, CD-ROM, digital versatile disks (DVD) or other optical storage, magnetic cassettes, magnetic tape, magnetic disk storage or other magnetic storage devices, or any other medium which can be used to store the desired information. Communication media typically embodies computer readable instructions, data structures, program modules, or other data in a modulated data signal such as a carrier wave or other transport mechanism and includes any information delivery media.

The present invention fits a function to the variance from the k-space data of an object at a displaced position to the k-space data of the object at a reference position and weights the function to account for noise in the k-space data. In fitting a weighted function to the variance, the weighting can be done by weighting the variance, weighting the overall function, or weighting the variance and the overall function. The displacement is found by using a least squares minimization on the weighted function.

One embodiment of the present invention is based on linear regression of the k-space navigator phase data. The displacement is found by fitting a straight line to the motion induced phase shift using a k-space weighted least squares approach according to the equation:

$$\hat{d}: \min \left\{ \sum_{k=-N/2}^{N/2-1} \frac{|S[k]|^2}{2\sigma^2} \left( \Delta\varphi[k] - \frac{2\pi}{N}kd \right)^2 \right\} \quad (5)$$

where $\Delta\phi[k] = \arg S_{dis}[k] - \arg S_{ref}[k]$.

The noise in the k-space phase data varies according to the inverse of the k-space signal to noise ratio (SNR), $|S[k]|/\sigma$, when the SNR is sufficiently high because the noise in the signal is approximately Gaussian. The present invention minimizes noise effects by selecting the weighting factor to be $$\frac{|S[k]|^2}{2\sigma^2}.$$

The weighting factor used results in the linear fit of motion-induced phase shift to be weighted more strongly to the high SNR points near the k-space center and only weakly to the poor SNR points at the edges of k-space. Additionally, the weightings are such that the average power of noise in the estimate is minimized. This makes the present method robust against noise, in contrast to Ahn and Cho's method where equal weightings are used for all data points.

The weighted least-squares method illustrated in equation 5 has the following closed-form solution:

$$\hat{d}_{kLS} = \frac{N}{2\pi} \frac{\sum_{k=-N/2}^{N/2-1} k|S[k]|^2 \Delta\varphi[k]}{\sum_{k=-N/2}^{N/2-1} k^2 |S[k]|^2} \quad (6)$$

Equation 6 shows that the method of the present invention requires only N multiplications and N additions per displacement estimate, if $k|S[k]|^2$ and $$\sum_{k=-N/2}^{N/2-1} k^2 |S[k]|^2$$

are pre-computed.

The Fourier shift theorem shown in equation 1 suggests that the phase change caused by motion is a linear function of spatial frequency k. In practice, the phase of a complex number is defined in the range of $-\pi$ to $\pi$. When the observed phase change is calculated as $\Delta\phi[k] = \arg S_{dis}[k] - \arg S_{ref}[k]$, it may contain discontinuities (e.g., jumps) that must be removed or unwrapped. In one embodiment, a simple phase unwrapping consisting of replacing jumps greater than $\pi$ with their $2\pi$ complements is used. This unwrapping works well when a SNR threshold is used to cut off noisy data points to ensure that the phase variation between adjacent k-space data points is sufficiently smooth. In one embodiment, the SNR threshold is approximately ten.

Figure 2:
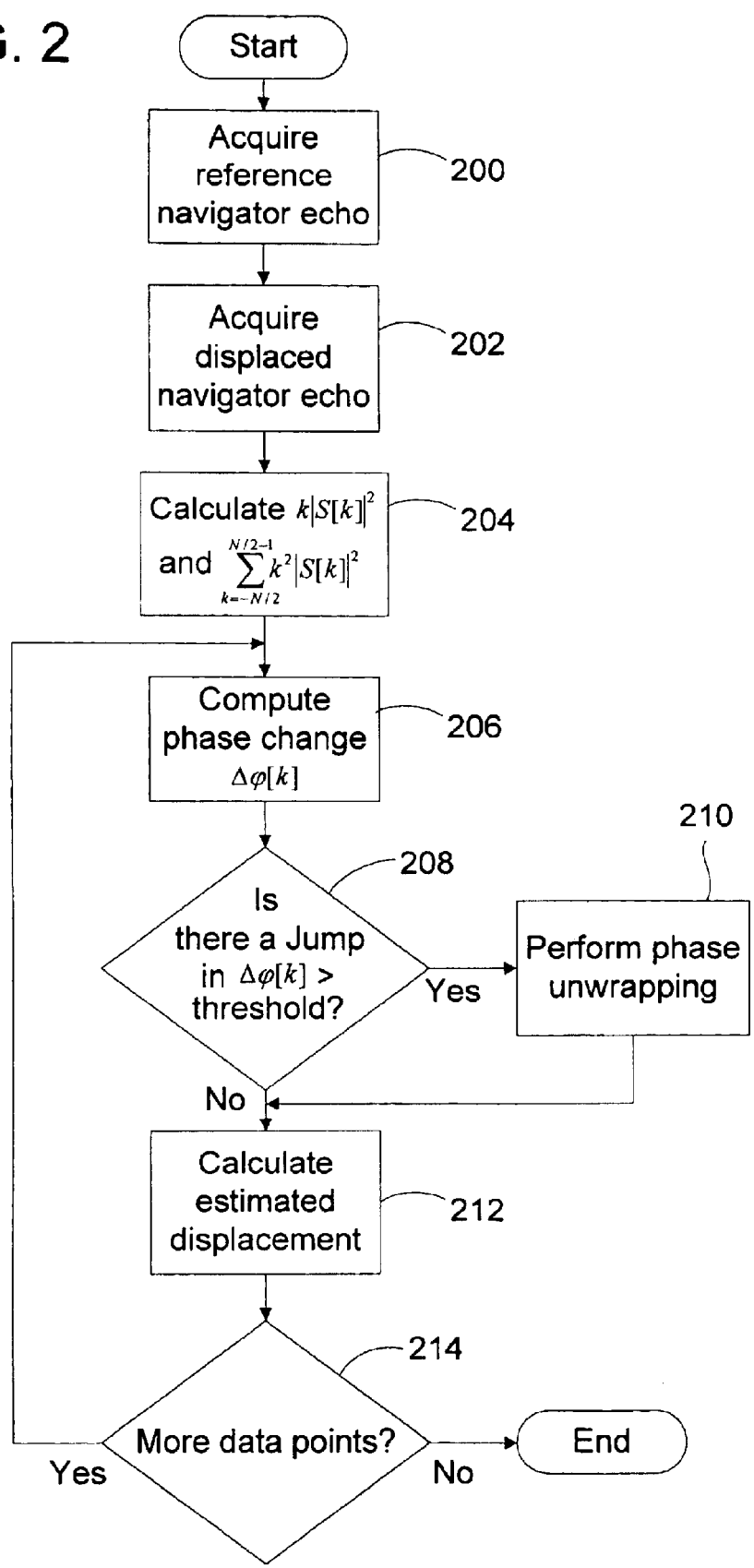
FIG. 2 is a flow chart of a process for acquiring linear motion displacement from raw k-space phase data in accordance with the present invention.

FIG. 2 shows a flow diagram of the steps taken to determine displacement from the navigator echo phase when there is no rotation or dilation. Those skilled in the art will recognize that some of the steps shown being performed sequentially can be performed in parallel. A reference navigator echo is acquired (step 200). Displaced navigator echoes are acquired (step 202). The $k|S[k]|^2$ and $$\sum_{k=-N/2}^{N/2-1} k^2 |S[k]|^2$$

are calculated (step 204) and the phase change Δϕ[k] is computed (step 206). If there is a jump in Δϕ[k] that is greater than a threshold (step 208), a phase unwrapping is performed (step 210). The threshold in one embodiment is π. If jumps greater than π occur, the jumps are replaced with their 2π complements. The estimated displacement is then calculated (step 212). If there are more data points (step 214), steps 206 to 214 are repeated.

Computer simulation and motion extraction experiments were performed to evaluate the accuracy and computational efficiency of the present invention and compared to the Ahn and Cho method. The effectiveness of these methods was then demonstrated by correcting for motion effects on a resolution motion phantom with obtained displacement information.

Figure 3:
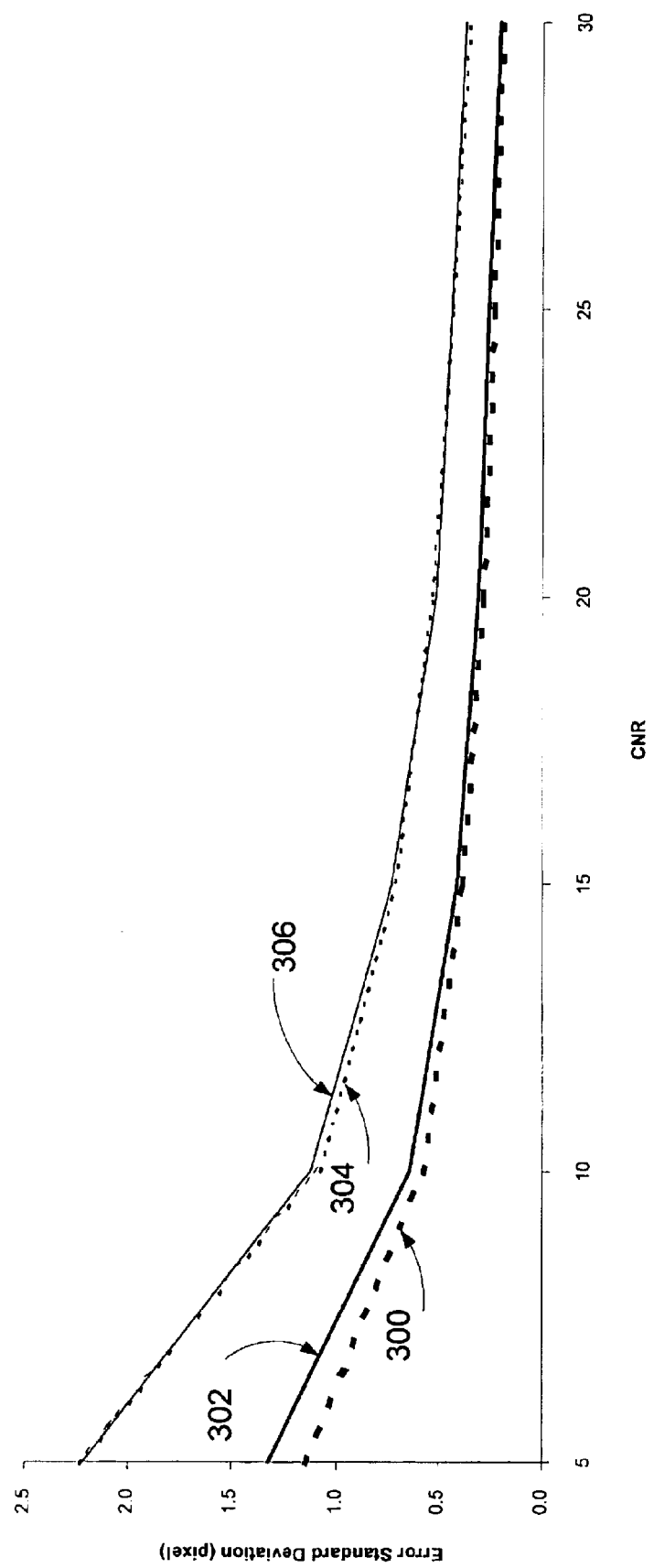
FIG. 3 illustrates standard deviations of estimation errors at different noise levels using a simulated navigator profile.

Turning now to FIG. 3, Monte-Carlo simulation was used to evaluate the accuracy of the present invention against Ahn and Cho's method for an idealized navigator profile at different noise levels. In each run, white Gaussian noise was independently added to the reference profile and a shifted profile of known displacement. These navigator profiles were processed by both methods, and the obtained displacement estimates were subtracted from the true displacement to determine the estimation errors. The standard deviations of these errors were used to compare the accuracy of the algorithms. FIG. 3 shows the standard deviations of estimation errors averaged over 5000 Monte-Carlo runs at various contrast-to-noise ratios (CNR's). A CNR is defined as the ratio of navigator profile peak and noise standard deviation. These error curves match well with theoretical curves. In FIG. 3, curve 300 is the theoretical error curve and curve 302 is the simulated estimation error curve for the method of the present invention Curve 304 is the theoretical curve and curve 306 is the simulated estimation error curve for the Ahn and Cho method. It can be seen that the present method outperforms the Ahn and Cho method.

Turning now to FIGS. 4a and 4b, a motion phantom was used to produce a known motion waveform for comparison with navigator measurements. The phantom consisted of a computer-controlled stepper motor, which drove a stagecoach in the direction of the magnet bore. A bottle of water was fixed on the stagecoach as the imaging object. To simulate the SI motion of human diaphragm, the motion waveform was set to a sinusoid with peak-to-peak amplitude of 4 cm and period of 4 sec. A pencil-beam navigator pulse sequence was used to collect navigator data. The sequence was run on a 1.5T MR imaging system (GE Medical Systems, Milwaukee, Wis.) and had the following parameters: TR=150 ms, TE=5 ms, flip angle=15°, bandwidth= 15.63 KHz, FOV=30 cm, 256-point navigator resolution. Navigator echoes were obtained and post-processed on a Sun Ultra2 workstation (Sun Microsystems, Palo Alto, Calif.).

FIG. 4a illustrates the displacement obtained with Ahn and Cho's method on the motion phantom and FIG. 4b illustrates the displacement obtained using the method of the present invention. Curves 402 and 406 illustrate the true motion. Curve 404 illustrates the estimated displacement obtained using the Ahn and Cho method and curve 408 illustrates the estimated displacement obtained using the method of the present invention. The average CPU times to process a 256-point phantom navigator echo on a Sun Ultra2 computer were 0.53 msec for the Ahn and Cho method and 0.57 msec for the present invention. The absolute errors averaged over 256 echoes were 2.0 mm for the Ahn and Cho method and 0.5 mm for the method of the present invention. The method of the present invention has four times the error reduction. The errors in peak-to-peak motion amplitudes averaged over 10 cycles of the sinusoid were 5.5 mm for Ahn and Cho's method and 1.3 mm for the method of the present invention, which results in four times the error reduction.

Turning now to FIGS. 5a–5d, displacement information obtained with the method of the present invention and Ahn and Cho's method were used to retrospectively correct motion effects on a resolution motion phantom. The phantom was programmed to undergo a sinusoidal motion with peak-to-peak amplitude of 4 cm and period of 4 sec. Motion correction was done in k-space by offsetting the motion phase shift according to equation 1. The effectiveness of motion correction using displacement estimates obtained is illustrated in FIGS. 5a–5d.

Figure 5A:
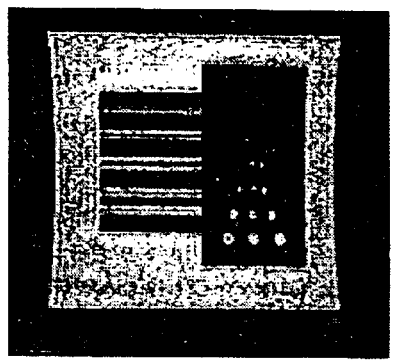
FIG. 5a illustrates a coronal image of a resolution motion phantom obtained without motion.
Figure 5B:
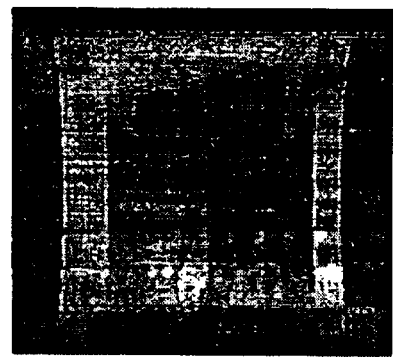
FIG. 5b illustrates a coronal image of the resolution motion phantom of FIG. 5a obtained without motion correction.
Figure 5C:
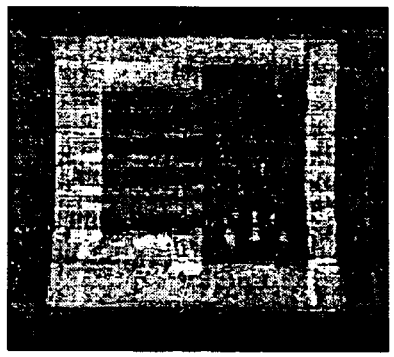
FIG. 5c illustrates a coronal image of the resolution motion phantom of FIG. 5b obtained with prior art motion correction.
Figure 5D:
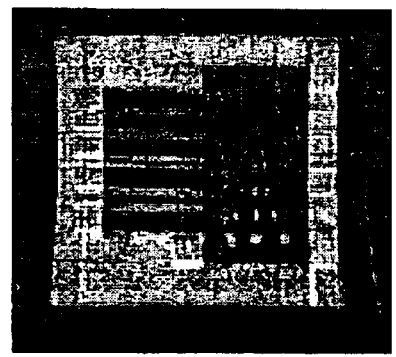
FIG. 5d illustrates a coronal image of the resolution motion phantom of FIG. 5b obtained with motion correction in accordance with the teachings of the instant invention.

FIG. 5a is a coronal image of the stationary phantom. FIG. 5b shows the image of the same phantom in motion obtained without motion correction, and a substantial amount of ghosting and blurring can be observed. These artifacts are suppressed considerably by applying motion correction to the same raw k-space data. FIG. 5c is the corrected image using motion derived from Ahn and Cho's method, and FIG. 5d is the corrected image using motion derived from the method of the present invention. FIG. 5d shows a better motion suppression compared to FIG. 5c, indicating a more accurate motion extraction using the present invention.

Turning now to FIGS. 6a and 6b, the Ahn and Cho method and the method of the present invention were also applied to data from the diaphragm of a human volunteer to detect respiratory motion. In this case the true motion is unknown, so an accurate but less efficient image-space least-squares fitting algorithm was used to provide the standard for comparison. The corresponding displacements obtained are illustrated in FIGS. 6a and 6b. FIG. 6a illustrates the estimated displacement using the Ahn and Cho method. Curve 600 is the image-space least squares fitting method and curve 602 is the estimated displacement using the Ahn and Cho method. FIG. 6b illustrates the estimated displacement using method in accordance with the present invention. Curve 604 is the image-space least squares fitting method and curve 606 is the estimated displacement using the method of the present invention.

Figure 7A:
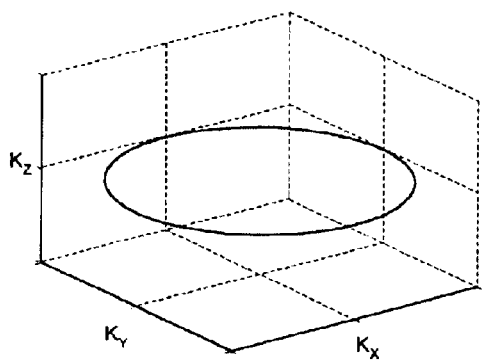
FIGS. 7a–f illustrate exemplary k-space trajectories for detecting motion of an object.
Figure 7B:
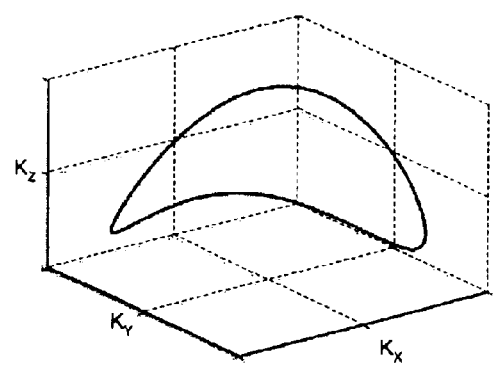
Figure 7C:
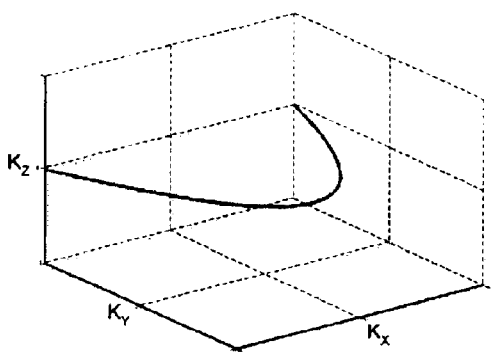
Figure 7D:
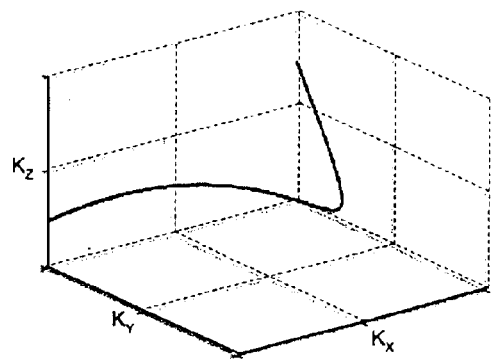
Figure 7E:
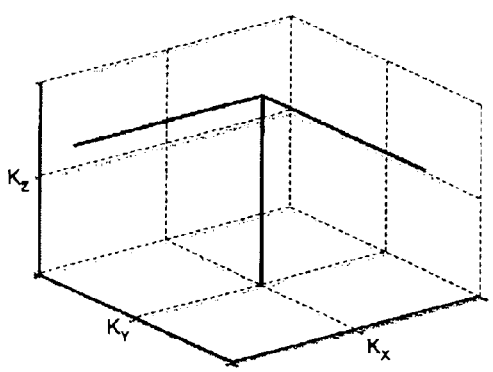

To detect multiple motion components such as rotation, dilation and displacement using a single navigator excitation, more sophisticated navigator echoes sensitized to motion such as defined by a k-space circle or spiral are needed. The trajectories are chosen to make processing easier. Examples of k-space trajectories include trajectories defined by orthogonal functions spanned over the duration of the navigator echo acquisition, such as sinusoidal functions such as (sin 2π(t/T–½), cos 2n(t/T–½), 1) (see FIG. 7a), Legendre functions (2t/T–1, ½(3(2t/T–1)²–1), 1) (see FIG. 7c), or higher order functions (see FIGS. 7b and 7d), where T is the sampling duration. Since image energy is concentrated in the center of k-space, functions that provide trajectories through or close to the center are more desirable. For example, the Legendre set which passes near the center and higher order functions permitted by gradient switching power may be more desirable (see FIGS. 7b, 7c, and 7d). Another approach to selecting a k-space trajectory is to use non-overlapping functions (see FIG. 7e), or some hybrid such as a k-space spiral trajectory (see FIG. 7f). In such cases, motion components are encoded in phase and/or magnitude of navigator data.

In an alternate embodiment of the present invention, the displacement is extracted from the navigator signal phase when motion is composed of translation, rotation, and dilation. General motion (i.e., rotation, dilation and displacement) is detected by first exciting the object whose motion is to be measured using selective volumetric excitation. Selective volumetric excitation of an object is done by transmitting a slab-selective pulse centered on the excitation frequency of the object to produce an excited signal that is sampled. If water is present, a spectral saturation pulse centered on water frequency is transmitted prior to the slab-selective saturation pulse to eliminate water from the excited signal. Spatial saturation RF pulses may also be transmitted to eliminate signals that may interfere with the excited signal.

Figure 7F:
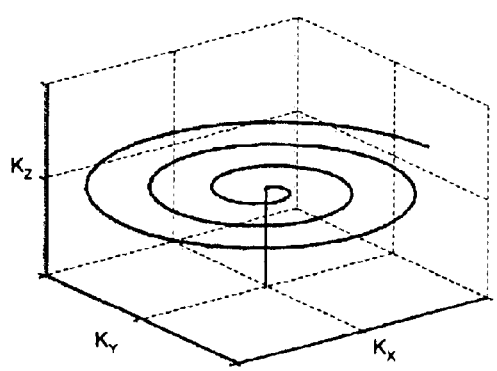

Once the object has been excited, the excited signal is sampled in k-space using one or more k-space trajectories that is sensitized to the motion of interest of the object to obtain k-space data. For example, the k-space trajectory shown in FIG. 7f is used to detect rotation and dilation of an object. The motion parameters are then extracted from the k-space data using the weighted k-space least squares method described hereinbelow. General motion experienced by a heart (e.g., coronary arteries) shall be used to illustrate this embodiment. Those skilled in the art recognize that the present invention can be used in other situations where there is general motion. For example, motion of the brain may be detected using the present invention.

Figure 8:
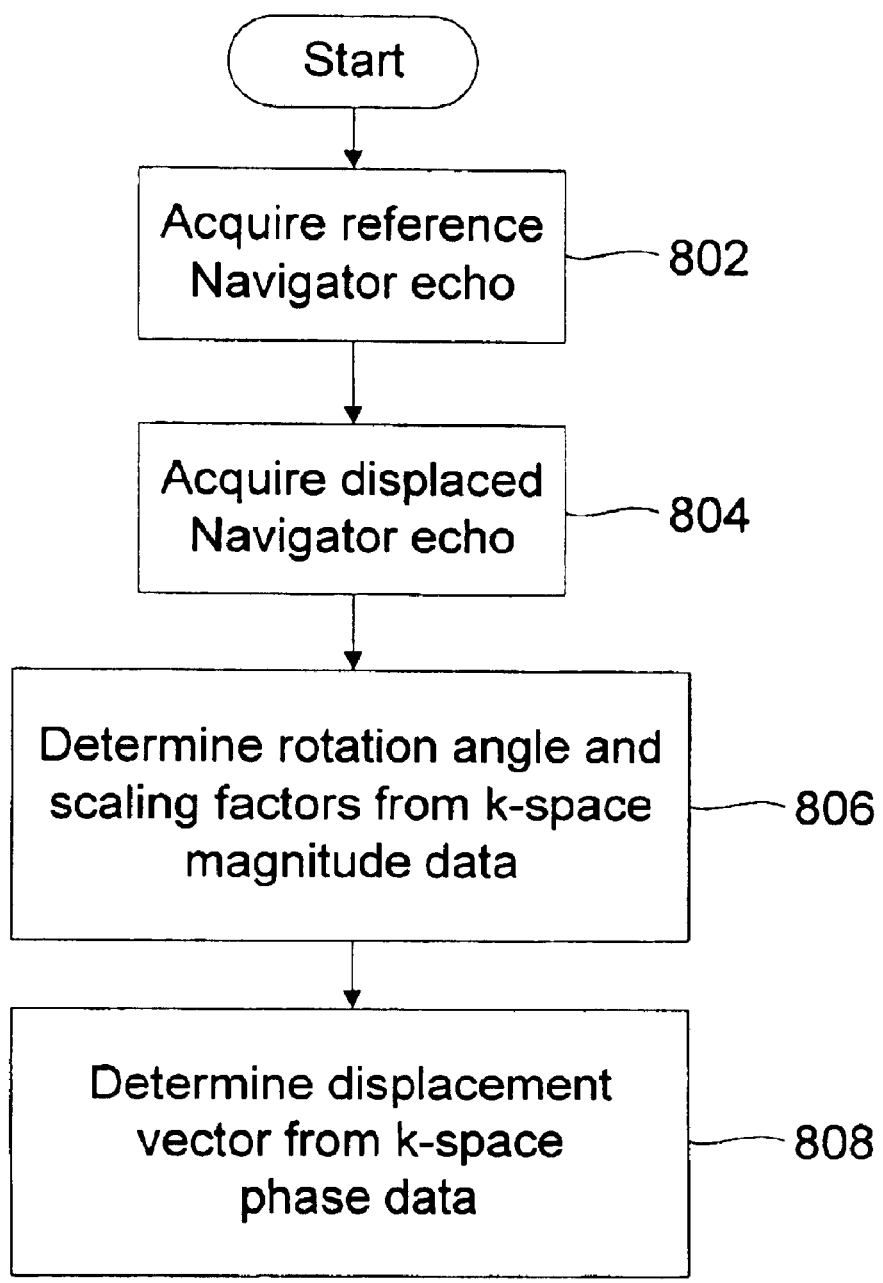
FIG. 8 is a flow chart of a process for acquiring rotation, dilation, and displacement from raw k-space magnitude and phase data in accordance with the present invention.

The heart is made of chamber blood, myocardium, and epicardial fat. The motion of coronary arteries correlates directly with the motion of the myocardium and epicardial fat, but not the motion of chamber blood. The myocardium and blood have the same resonance frequency, which makes it difficult to excite the myocardium to determine motion without getting interference that is caused by exciting the chamber blood. However, by spatially selective excitation of epicardial fat, coronary artery motion can be directly monitored because the epicardial fat can be excited without exciting the chamber blood. Turning now to FIG. 8, the overall steps to extract displacement are shown. A reference navigator echo is acquired (step 802). A displaced navigator echo is acquired (step 804). Volume-selective excitation is used to acquire the navigator echoes. For coronary motion, volume-selective excitation is accomplished by transmitting a spatial spectral selective pulse to eliminate signals from the chest wall and to excite epicardial fat to produce an excited signal.

Figure 9:
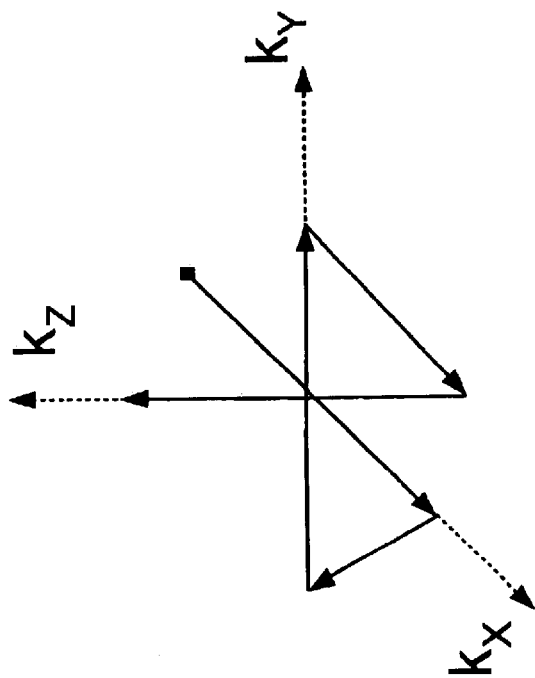
FIG. 9 illustrates an exemplary k-space trajectory for detecting coronary artery motion.

The spatial spectral selective pulse may be implemented several ways. For example, it can be implemented by transmitting a spatial saturation pulse to suppress signals outside the six walls of the heart (i.e., the interior, superior, right, left, anterior, and posterior walls) and transmitting a one dimensional selective pulse centered on epicardial fat frequency to excite the epicardial fat. Alternatively, the implementation may be transmitting a spatial saturation pulse to suppress signals outside four walls of the heart and transmitting a two dimensional selective train in the direction of the heart that was not saturated and centered on the epicardial fat frequency to excite the epicardial fat. For example, if the superior and interior walls are not saturated, the direction of the heart chosen is along the S-I direction. In an alternate embodiment, the implementation is transmitting a spatial saturation pulse to suppress signals outside two walls of the heart and transmitting a three dimensional selective pulse in the two directions of the heart not saturated and centered on the epicardial fat frequency to excite the epicardial fat. For example, if the two walls that are saturated are the right and left walls, the selective pulse is transmitted in the S-I direction and the A-P direction. If the two walls that are saturated are the anterior and posterior walls, the selective pulse is transmitted in the S-I direction and the R-L direction. If the two walls that are saturated are the interior and superior walls, the selective pulse is transmitted in the A-P direction and the R-L direction. In a further alternate embodiment, the implementation is transmitting a four dimensional selective pulse in the S-I, A-P and R-L directions of the heart and centered on the epicardial fat frequency to excite the epicardial fat. The pulses can be transmitted in a single pulse train or as separate pulses. The delay between pulses should be as small as possible. The excited epicardial fat signal is then sampled in k-space. A piece-wise linear k-space trajectory along the $k_x$, $k_y$, and $k_z$ axes that may be used is illustrated in FIG. 9. It should be noted that other trajectories such as a k-space circle or spiral may also be used.

Figure 11:
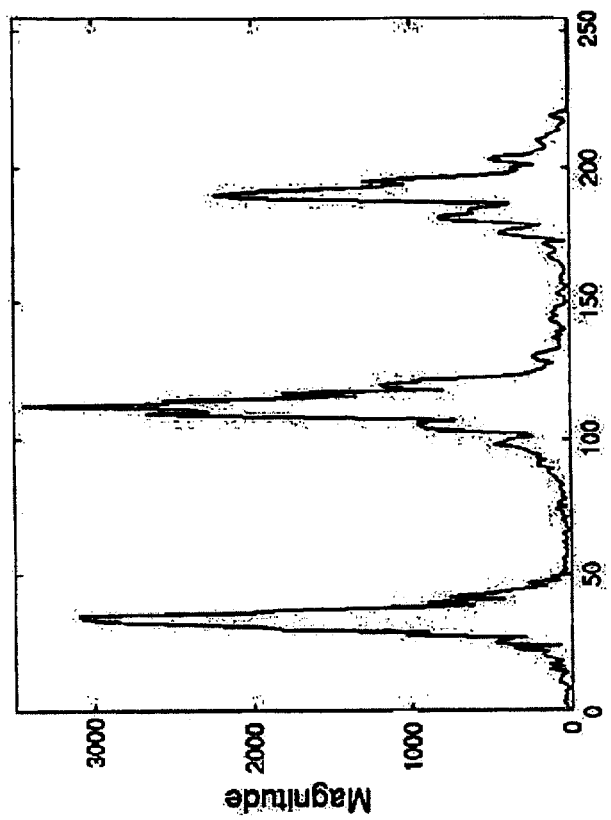
FIG. 11 illustrates the navigator echoes corresponding to the k-space trajectory of FIG. 9.

FIG. 10a is an axial image of heart volume without water saturation and FIG. 10b is an axial image of heart volume with water saturation. FIG. 10c is an axial image of heart volume with water saturation and spatial fat saturation (i.e., the figure only contains epicardial fat signal from the heart). The data was gathered using a 1.5T MR system (General Electric, Milwaukee, Wis.). The following parameters were used: FOV=30 cm, slice thickness=90 mm, TR=58ms, flip angle=30°, BW=15.63 kHz, 1.17 mm resolution. FIG. 11 shows a sample of the acquired navigator echo in one TR. The three echo peaks correspond to the three line segments along the k-space axes. The phase changes are proportional to the corresponding displacement of the epicardial fat.

Returning now to FIG. 8, the rotation angle and scaling factors due to contraction and respiration are determined from the k-space magnitude data as described below (step 806). The displacement vector from the k-space phase data is then determined (step 808). The rotation angle, scaling factors, and displacement vector of general motion of a heart is determined as follows. Let x be the position vector (x, y, z)$^T$, $D_r$ the displacement vector associated with respiration, and the dilation/contraction along the xyz axis as $a_x$, $a_y$, $a_z$. The respiratory motion component can be expressed in a matrix form:

$$x' = \begin{pmatrix} a_x & 0 & 0 \\ 0 & a_y & 0 \\ 0 & 0 & a_z \end{pmatrix}(x - D_r) \equiv C_r(x - D_r) \quad (7)$$

Cardiac motion can be expressed conveniently in a coordinate system XYZ, with Z the long axis of the heart and XZ in the septum plane. The transformation from the xyz coordinate system to the XYZ coordinate system consists of 1) rotating about the x-axis until the z-axis becomes the Z-axis and 2) rotating about the Z-axis until the x-axis gets to the septum (XZ) plane. Both rotating angles can be easily measured from scout scans of the heart. The Jacobian associated with this transformation (J) is the product of these two rotations and can be obtained from a scout scan. The rotation and contraction associated with cardiac motion, adding the respiratory component, is composed of transforming from xyz to XYZ, contraction/dilation, rotation, and transforming from XYZ back to xyz:

$$x'' = J^{-1}(R_c C_c J - D_c J) C_r (x - D) \equiv A(x - D) \quad [8]$$

In equation 8, $R_c$ is the rotation matrix pertaining to cardiac motion, $C_c$ is the contraction matrix pertaining to contraction, $C_r$ is the respiration matrix pertaining to respiration, $D_c$ is the displacement due to cardiac motion, and D is the displacement. The k-space expression of the motion effects $f_m(x)=f(A(x-D))$ is:

$$F_m(k)=e^{ik \cdot D} F((A^{-1})^T k) \quad [9]$$

The six motion parameters in the matrix A (i.e., the rotation angle in $R_c$, the two scaling factors in $C_c$, and the three scaling factors in $C_r$) are determined from the magnitude k-space data by using a least squares minimization:

$$min\{\Sigma_k |S(k)/\sigma|^2 (|F_m(A^T k)|-|F(k)|)^2\} \quad [10]$$

where the factor $$\frac{2\pi}{N}$$

is factored into the unit for k.

The motion parameters in matrix A can be obtained by sampling a k-space volume where $A^T k$ might be located around k, and a resampling search as known in the art. Once the matrix A is determined, the displacement vector D can be obtained from the phase difference using the least squared approach:

$$min\{\Sigma_k |S(k)/\sigma|^2 (\Delta\Phi(k)-kD)^2\}. \quad [11]$$

Figure 12A:
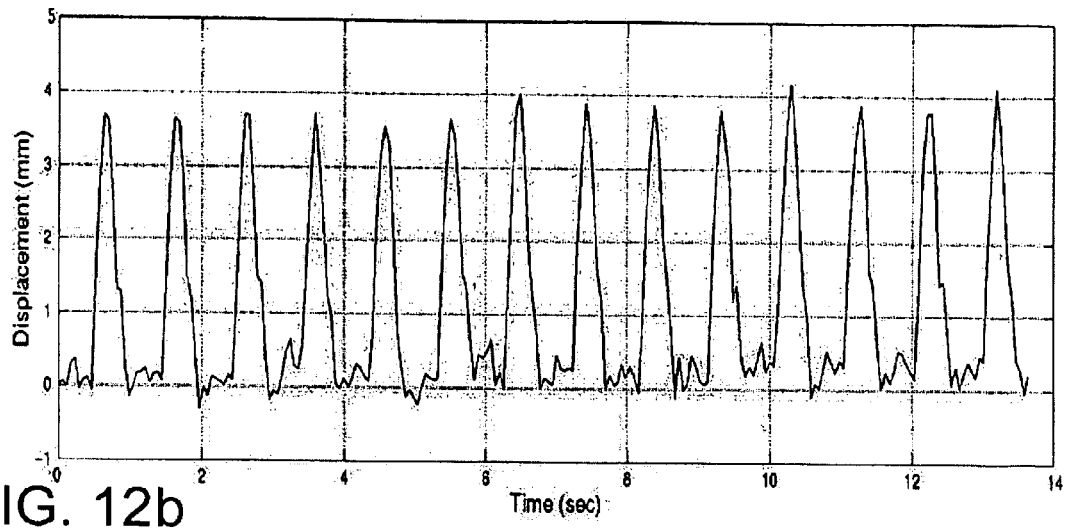
FIG. 12a illustrates RL displacement of human coronary arteries obtained with the teachings of the present invention.
Figure 12B:
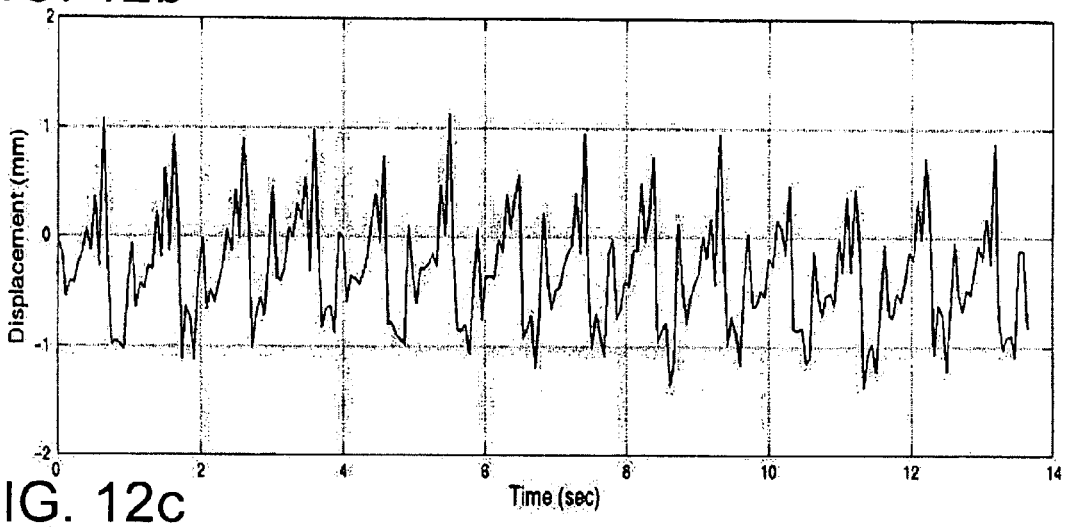
FIG. 12b illustrates AP displacement of human coronary arteries obtained with the teachings of the present invention.
Figure 12C:
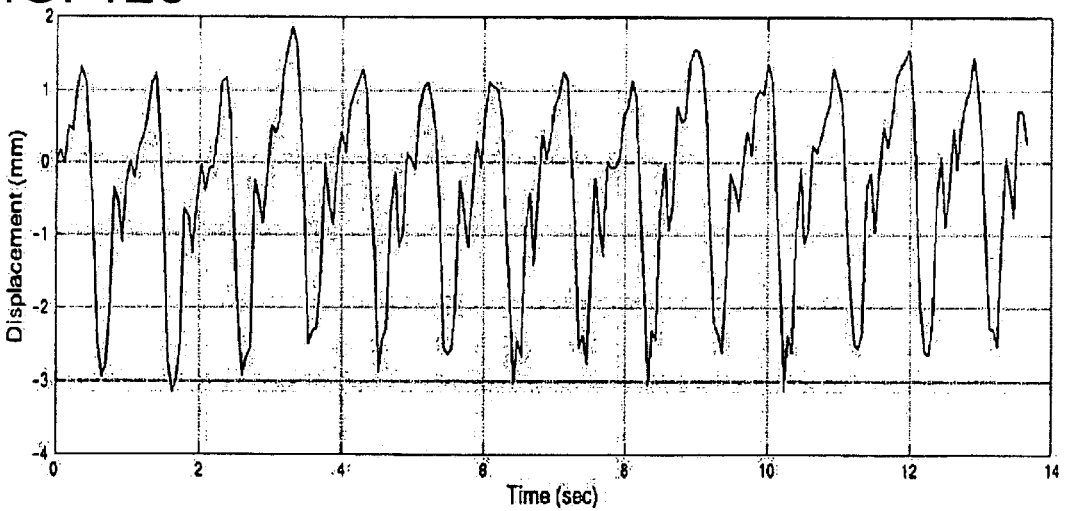
FIG. 12c illustrates SI displacement of human coronary arteries obtained with the teachings of the present invention.

FIGS. 12a–c shows the detected waveforms of a volunteer in the right-left (RL), anterior-posterior (AP), and cranial-caudal (superior-inferior, SI) directions without the effects of rotation and dilation taken into account. FIG. 12a is the RL direction waveform, FIG. 12b is the AP direction waveform, and FIG. 12c is the SI direction waveform. The waveforms of FIG. 12 were extracted from signal phases around the peaks of the navigator echo of FIG. 11.

Respiratory and coronary motion detection obtained with the method of the present invention on healthy human volunteers was performed using a 1.5T MR system (General Electric, Milwaukee, Wis.). The navigator pulse sequence used for spatially selective excitation of epicardial fat (i.e., volumetric excitation) was: FOV=180 mm, slice thickness= 90 mm, 1-4-6-4-1 binomial spatial-spectral pulse centered on water frequency, flip angle=30°, BW=15.63 kHz, TR=40 ms. Data was acquired successively with and without breath-holding to correlate the respiratory motion of the diaphragm with coronary motion. Coronary imaging is often performed by gating data acquisition to the ECG signal. The coronary motion was sampled immediately after arrival of the ECG signal.

Figure 14A:
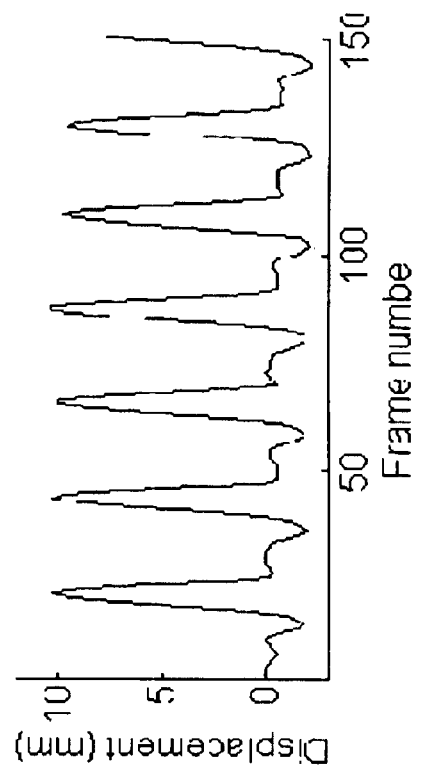
FIG. 14a illustrates diaphragm motion in the SI direction with breath-holding obtained with the teachings of the present invention.
Figure 14B:
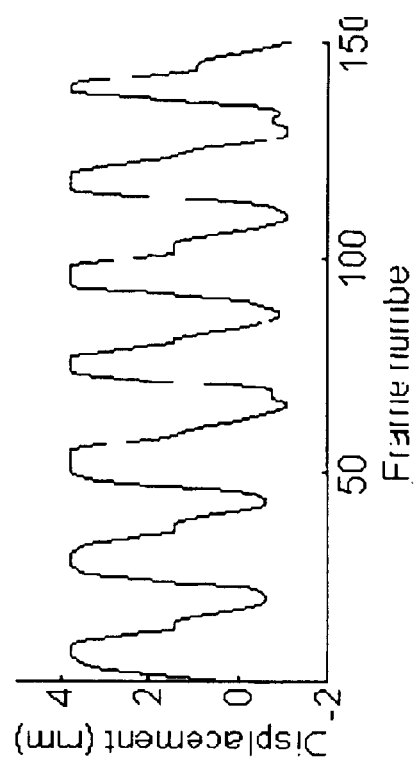
FIG. 14b illustrates coronary motion in the SI direction with breath-holding obtained with the teachings of the present invention.
Figure 14C:
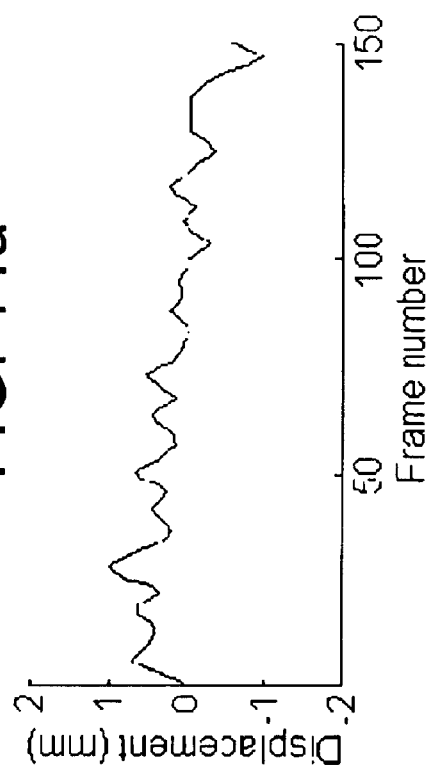
FIG. 14c illustrates coronary motion in the AP direction with breath-holding obtained with the teachings of the present invention.
Figure 14D:
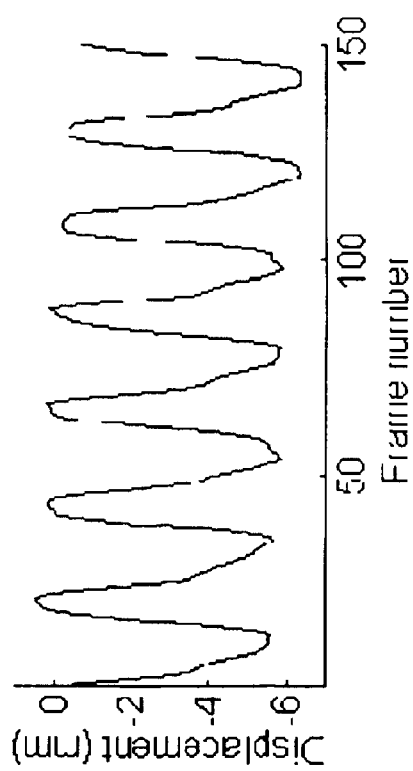
FIG. 14d illustrates coronary motion in the RL direction with breath-holding obtained with the teachings of the present invention.

Bulk motion of the diaphragm and coronary arteries without breath-holding obtained using the method of the present invention are illustrated in FIGS. 13a–d. The sampling frame rate in the figures is 60 ms/frame. FIG. 13a shows the diaphragm motion in the SI direction. FIG. 13b shows cardiac motion in the SI direction. FIG. 13c shows cardiac motion in the AP direction and FIG. 13d shows cardiac motion in the RL direction. The figures show that coronary motion is affected by respiratory motion primarily in the SI direction as expected, but also in the RL and AP direction. This effect is absent with breath-holding, as shown in FIGS. 14a–d. The sampling frame rate in the figures is 60 ms/frame. FIG. 14a shows the diaphragm motion in the SI direction. FIG. 14b shows cardiac motion in the SI direction, FIG. 14c shows cardiac motion in the AP direction, and FIG. 13d shows cardiac motion in the RL direction. The small drift of the diaphragm position in FIG. 14a is due to imperfect breath-holding. The effects of the imperfect breath-holding observed coronary motion is seen in FIGS. 14b–d. This demonstrates the high motion sensitivity of the volumetric navigator echo method of the present invention.

Figure 15:
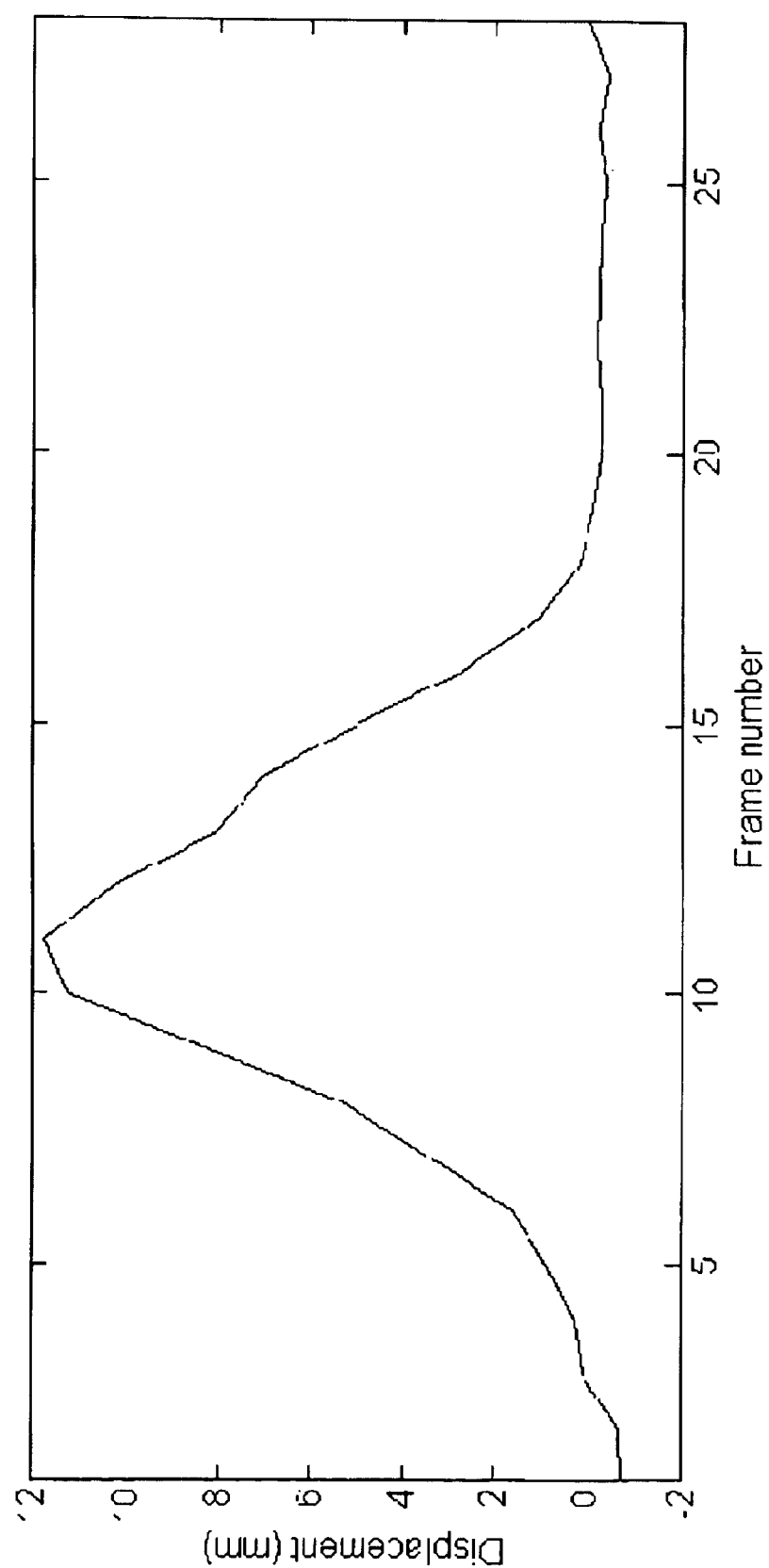
FIG. 15 illustrates one cycle of cardiac motion in the RL direction with ECG gating.

FIG. 15 shows a full cycle of cardiac motion in the RL direction with ECG gating and breath-holding obtained using the method of present invention. The sampling frame rate in the figure is 40 ms/frame. The rest period of approximately 200 milliseconds and the optimal delay time of approximately 800 milliseconds can be seen in FIG. 15. The heart rate of the volunteer was 50 beats per minute. The pattern of coronary motion shows a gradual slowing of motion before the rest period and substantial motion after the rest period. The rest period observed in volunteers with tachycardia is shorter (not shown). These observations are consistent with known cardiac physiology.

The volumetric navigator method of the present invention provides accurate bulk translation information of the coronary arteries. It can be used to detect the respiratory motion of the heart directly and may replace pencil-beam navigator echo for detecting respiratory motion. The methods of the present invention is also sensitive to cardiac motion and can identify the optimal delay time and the rest period within the cardiac cycle. It has the potential of replacing the ECG signal for triggering data acquisition and can provide the optimal data sampling window to minimize both respiratory and cardiac motion artifacts.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method to determine a displacement of an object that is displaced from a reference position comprising the steps of:

acquiring a current navigator echo comprising a first set of k space data of the object at a displaced position;

acquiring a reference navigator echo comprising a second set of k space data of the object at the reference position;

fitting a weighted function to a variance between the first set of k space data and the second set of k space data using a least squares minimization;

determining the displacement from the weighted function.

2. The method of claim 1 wherein the weighted function includes a weighting factor proportional to the square of a k-space signal to noise ratio.

3. The method of claim 1 wherein the weighted function is a weighted straight line to motion induced phase shift and the step of determining the displacement from the weighted function comprises the step of determining the displacement according to the equation $$\hat{d}_{kLS} = \frac{N}{2\pi} \frac{\sum_{k=-N/2}^{N/2-1} k|S[k]|^2 \Delta\varphi[k]}{\sum_{k=-N/2}^{N/2-1} k^2|S[k]|^2}.$$

4. The method of claim 3 further comprising the step of pre-computing $k|S[k]|^2$ and $$\sum_{k=-N/2}^{N/2-1} k^2|S[k]|^2.$$

5. A method to determine a displacement of an object that is displaced from a reference position comprising the steps of:
acquiring k space phase data corresponding to a displaced position and the reference position;
fitting a weighted straight line to the k-space phase data using a least squares minimization; and
determining the displacement from the weighted straight line.

6. The method of claim 5 wherein the weighted straight line has a weighting factor proportional to the square of a k-space signal-to-noise ratio.

7. The method of claim 6 wherein the weighting factor is equal to one half of the square of the k-space signal-to-noise ratio.

8. A method to determine a displacement of an object that is rotated, dilated and displaced from a reference position comprising the steps of:
obtaining k-space magnitude and k-space phase data corresponding to a displaced image space navigator echo and the reference position;
determining motion parameters due to rotation and dilation from the k-space magnitude data using a weighted least squares minimization; and
determining the displacement from the k-space phase data using the motion parameters and a second weighted least squares minimization.

9. The method of claim 8 wherein the object comprises coronary arteries, the method further comprising the step of:
transmitting a spatial spectral selective pulse to excite epicardial fat to produce an excited signal.

10. The method of claim 9 wherein the step of transmitting a spatial spectral selective pulse comprises the steps of:
transmitting a spatial saturation pulse to suppress signals outside the interior, superior, right, left, anterior, and posterior walls of the heart; and
transmitting a one dimensional selective pulse centered on epicardial fat frequency to excite the epicardial fat.

11. The method of claim 9 wherein the step of transmitting a spatial spectral selective pulse comprises the steps of
transmitting a spatial saturation pulse to suppress signals outside four walls of the heart, the four walls of the heart selected from the superior, interior, right, left, anterior, and posterior walls of the heart; and
transmitting a two dimensional selective pulse in the S-I direction of the heart and centered on the epicardial fat frequency to excite the epicardial fat if the four walls are the right, left, anterior and posterior walls;
transmitting a two dimensional selective pulse in the A-P direction of the heart and centered on the epicardial fat frequency to excite the epicardial fat if the four walls are the superior, interior, right, and left walls;
transmitting a two dimensional selective pulse in the R-L direction of the heart and centered on the epicardial fat frequency to excite the epicardial fat if the four walls are the superior, interior, anterior and posterior walls.

12. The method of claim 9 wherein the step of transmitting a spatial spectral selective pulse comprises the steps of
transmitting a spatial saturation pulse to suppress signals outside two walls of the heart, the two walls of the heart selected from the superior, interior, right, left, anterior, and posterior walls of the heart; and
transmitting a three dimensional selective pulse in the A-P direction and the R-L direction of the heart and centered on the epicardial fat frequency to excite the epicardial fat if the two walls are the superior and interior walls;
transmitting a three dimensional selective pulse in the S-I direction and the A-P direction of the heart and centered on the epicardial fat frequency to excite the epicardial fat if the two walls are the right and left walls; and
transmitting a three dimensional selective pulse in the S-I direction and the R-L direction of the heart and centered on the epicardial fat frequency to excite the epicardial fat if the two walls are the anterior and superior walls.

13. The method of claim 9 wherein the step of transmitting a spatial spectral selective pulse comprises the step of transmitting a four dimensional selective pulse in the S-I, A-P and R-L directions of the heart and centered on the epicardial fat frequency to excite the epicardial fat.

14. The method of claim 8 wherein the step of obtaining k-space magnitude and k-space phase data corresponding to a displaced image space navigator echo and the reference position includes the steps of:
exciting the object to produce an excited signal;
sampling the excited signal in k-space to obtain the k-space magnitude and k-space phase data.

15. The method of claim 14 wherein the step of sampling the excited signal in k-space comprises the step of sampling the excited signal in k-space using a k-space trajectory sensitized to the motion parameters of the object.

16. The method of claim 8 wherein the step of determining motion parameters due to rotation and dilation includes the step of determining a rotation angle and a plurality of scaling factors.

17. The method of claim 8 wherein the second weighted least squares minimization includes a weighting factor proportional to the square of a k-space signal to noise ratio.

18. The method of claim 8 further comprising the steps of:
acquiring the displaced image space navigator echo using volume-selective excitation; and
acquiring a reference navigator echo at the reference position using volume-selective excitation.

19. The method of claim 8 wherein the step of determining motion parameters due to rotation and dilation from the k-space magnitude data using a weighted least squares minimization comprises determining the motion parameters from the equation $$\min\{\Sigma_k |S(k)/\sigma|^2 (|F_m(A^T k)| - |F(k)|)^2\}.$$

20. The method of claim 19 wherein the step of determining the displacement for the k-space phase data using the motion parameters and a second weighted least squares minimization comprises determining the displacement from the equation $$\min\{\Sigma_k |S(k)/\sigma|^2 (\Delta\phi(k)-kD)^2\}.$$

21. A method to determine motion parameters of an object comprising the steps of:
exciting the object using selective volumetric excitation to produce an excited signal;
obtaining k-space data by sampling the excited signal in k-space using a k-space trajectory sensitized to the motion parameters of the object; and
extracting the motion parameters from the k-space data using a weighted k-space least squares minimization.

22. The method of claim 21 wherein the object is at least one human heart coronary artery having a portion surrounded at least in part with epicardial fat and wherein the step of exciting the object comprises transmitting a spatial spectral selective pulse to excite epicardial fat.

23. The method of claim 21 wherein the step of extracting the motion parameters from the k-space data using a weighted k-space least squares minimization comprises the steps of:
determining rotation and dilation motion parameters due to rotation and dilation from the k-space magnitude data using a weighted least squares minimization; and
determining a displacement for the k-space phase data using the rotation and dilation motion parameters and a second weighted least squares minimization.

24. The method of claim 21 wherein the k-space is defined by three axes and the k-space trajectory crosses the three axes.

25. The method of claim 21 wherein the k-space is defined by three axes and the k-space trajectory comprises a spiral in a plane defined by two of the three axes, the spiral connected to a line parallel to the other of the three axes that does not define the plane.

26. The method of claim 21 wherein the k-space is defined by three axes and the k-space trajectory comprises an orthogonal function.

27. The method of claim 26 wherein the orthogonal function includes one of a sinusoidal function and a Legendre function.

28. A method of detecting coronary artery motion comprising the steps of: transmitting a spatial spectral selective pulse to excite epicardial fat to produce an excited signal; obtaining k-space data by sampling the excited signal using at least one k-space trajectory; and extracting motion from the k-space data using least square minimization.

29. The method of claim 28 wherein the step of transmitting a spatial spectral selective pulse comprises the steps of:
transmitting a spatial saturation pulse to suppress signals outside the interior, superior, right, left, anterior, and posterior walls of the heart; and
transmitting a one dimensional selective pulse centered on epicardial fat frequency to excite the epicardial fat.

30. The method of claim 28 wherein the step of transmitting a spatial spectral selective pulse comprises the steps of
transmitting a spatial saturation pulse to suppress signals outside four walls of the heart, the four walls of the heart selected from the superior, interior, right, left, anterior, and posterior walls of the heart; and
transmitting a two dimensional selective pulse in the S-I direction of the heart and centered on the epicardial fat frequency to excite the epicardial fat if the four walls are the right, left, anterior and posterior walls;
transmitting a two dimensional selective pulse in the A-P direction of the heart and centered on the epicardial fat frequency to excite the epicardial fat if the four walls are the superior, interior, right, and left walls;
transmitting a two dimensional selective pulse in the R-L direction of the heart and centered on the epicardial fat frequency to excite the epicardial fat if the four walls are the superior, interior, anterior and posterior walls.

31. The method of claim 28 wherein the step of transmitting a spatial spectral selective pulse comprises the steps of
transmitting a spatial saturation pulse to suppress signals outside two walls of the heart, the two walls of the heart selected from the superior, interior, right, left, anterior, and posterior walls of the heart; and
transmitting a three dimensional selective pulse in the A-P direction and the R-L direction of the heart and centered on the epicardial fat frequency to excite the epicardial fat if the two walls are the superior and interior walls;
transmitting a three dimensional selective pulse in the S-I direction and the A-P direction of the heart and centered on the epicardial fat frequency to excite the epicardial fat if the two walls are the right and left walls; and
transmitting a three dimensional selective pulse in the S-I direction and the R-L direction of the heart and centered on the epicardial fat frequency to excite the epicardial fat if the two walls are the anterior and superior walls.

32. The method of claim 28 wherein the step of transmitting a spatial spectral selective pulse comprises the step of transmitting a four dimensional selective pulse in the S-I, A-P and R-L directions of the heart and centered on the epicardial fat frequency to excite the epicardial fat.

33. The method of claim 28 wherein the k-space data comprises k-space magnitude data and k-space phase data and the step of extracting motion from the k-space data comprises the steps of:
determining motion parameters due to rotation and dilation from the k-space magnitude data using a weighted least squares minimization; and
determining a displacement for the k-space phase data using the motion parameters and a second weighted least squares minimization.

34. The method of claim 33 wherein the step of determining motion parameters due to rotation and dilation from the k-space magnitude data using a weighted least squares minimization comprises determining the motion parameters from the equation $$\min\{\Sigma_k |S(k)/\sigma|^2 \ (F_m(A^T k)|-|F(k)|)^2\}.$$

35. The method of claim 33 wherein the step of determining the displacement for the k-space phase data using the motion parameters and a second weighted least squares minimization comprises determining the motion parameters from the equation $$\min\{\Sigma_k |S(k)/\sigma|^2 (\Delta\phi(k)-kD)^2\}.$$

36. The method of claim 28 wherein the k-space is defined by three axes and the k-space trajectory crosses the three axes.

37. The method of claim 28 wherein the k-space is defined by three axes and the k-space trajectory comprises a spiral in a plane defined by two of the three axes, the spiral connected to a line parallel to the other of the three axes that does not define the plane.

38. The method of claim 28 wherein the k-space is defined by three axes and the k-space trajectory comprises an orthogonal function.

39. The method of claim 38 wherein the orthogonal function includes one of a sinusoidal function and a Legendre function.

40. A method to apply motion correction to k-space data for an object that is rotated, dilated and displaced from a reference position comprising the steps of:

obtaining k-space magnitude and k-space phase data corresponding to a displaced image space navigator echo and the reference position;

determining motion parameters in the matrix A in the motion effects equation $F_m(k)=e^{ik \cdot D}F((A^{-1})^T k)$ due to rotation and dilation from the k-space magnitude data using a weighted least squares minimization;

determining the displacement D for the k-space phase data using the motion parameters and a second weighted least squares minimization; and compensating the k-space data for the motion effects using the motion parameters and the displacement D.

41. The method of claim 40 wherein the step of determining the motion parameters comprises determining the motion parameters from the equation $$\min\{\Sigma_k |S(k)/\sigma|^2 (|F_m(A^T k)|-|F(k)|)^2\}.$$

42. The method of claim 40 wherein the step of determining the displacement D comprises determining the displacement D from the equation $$\min\{\Sigma_k |S(k)/\sigma|^2 (\Delta\phi(k)-KD)^2\}.$$

* * * * *

UNITED STATES PATENT AND TRADEMARK OFFICE
CERTIFICATE OF CORRECTION

PATENT NO. : 6,791,323 B2
DATED : September 14, 2004
INVENTOR(S) : Yi Wang et al.

It is certified that error appears in the above-identified patent and that said Letters Patent is hereby corrected as shown below:

Column 18,
Line 17, change "KD" to -- kD --.

Signed and Sealed this

Fourth Day of January, 2005

JON W. DUDAS
*Director of the United States Patent and Trademark Office*